United States Patent
Chen et al.

(10) Patent No.: US 10,218,183 B2
(45) Date of Patent: Feb. 26, 2019

(54) HOUSEHOLD PHOTOVOLTAIC SYSTEM AND SMART MICRO-GRID SYSTEM

(71) Applicants: BOE TECHNOLOGY GROUP CO., LTD., Beijing (CN); BEIJING BOE ENERGY TECHNOLOGY CO., LTD., Beijing (CN)

(72) Inventors: Cheng Chen, Beijing (CN); Xiaoyan Han, Beijing (CN); Xingbin Song, Beijing (CN)

(73) Assignees: BOE TECHNOLOGY GROUP CO., LTD. (CN); BEIJING BOE ENERGY TECHNOLOGY CO., LTD. (CN)

( * ) Notice: Subject to any disclaimer, the term of this patent is extended or adjusted under 35 U.S.C. 154(b) by 0 days.

(21) Appl. No.: 15/521,470

(22) PCT Filed: Oct. 28, 2016

(86) PCT No.: PCT/CN2016/103796
§ 371 (c)(1),
(2) Date: Apr. 24, 2017

(87) PCT Pub. No.: WO2017/128787
PCT Pub. Date: Aug. 3, 2017

(65) Prior Publication Data
US 2018/0323745 A1    Nov. 8, 2018

(30) Foreign Application Priority Data
Jan. 26, 2016 (CN) .......................... 2016 1 0052854

(51) Int. Cl.
*H02J 3/38* (2006.01)
*H02S 40/32* (2014.01)
(Continued)

(52) U.S. Cl.
CPC ............ *H02J 3/383* (2013.01); *G06F 1/3203* (2013.01); *H01L 31/042* (2013.01);
(Continued)

(58) Field of Classification Search
CPC ..... H02S 40/32; G06F 1/3203; H01L 31/042; H02J 3/383; H02J 13/0013
See application file for complete search history.

(56) References Cited

U.S. PATENT DOCUMENTS 7,977,818 B1 * 7/2011 Wahl .................. H02J 3/383
                                                       307/45
2012/0057520 A1    3/2012 Mumtaz
2016/0119744 A1    4/2016 Yoon

FOREIGN PATENT DOCUMENTS

CN       102148864 A     8/2011
CN       202026335 U    11/2011
(Continued)

OTHER PUBLICATIONS

First Office Action for Chinese Application No. 201610052854.3, dated Apr. 19, 2017, 11 Pages.
(Continued)

*Primary Examiner* — Daniel Cavallari-See
(74) *Attorney, Agent, or Firm* — Brooks Kushman P.C.

(57) ABSTRACT

The present disclosure provides a household photovoltaic system and a smart micro-grid system. The household photovoltaic system includes a photovoltaic assembly module, a household photovoltaic inverter and an AC grid. The household photovoltaic system further includes a monitoring assembly and a wireless communication assembly. The monitoring assembly includes DC-side monitoring assemblies each configured to monitor an operating parameter of an output end of the photovoltaic assembly module, and AC-side monitoring assemblies each configured to monitor an operating parameter of an output end of the household
(Continued)

photovoltaic inverter. The wireless communication assembly includes a DC-side wireless communication assembly and an AC-side wireless communication assembly which are configured to transmit the operating parameters monitored by each DC-side monitoring assembly and each AC-side monitoring assembly to a predetermined monitoring terminal.

20 Claims, 5 Drawing Sheets

(51) Int. Cl.
*H01L 31/042* (2014.01)
*H02J 13/00* (2006.01)
*G06F 1/3203* (2019.01)

(52) U.S. Cl.
CPC .......... *H02J 13/0013* (2013.01); *H02S 40/32* (2014.12); *Y02E 10/563* (2013.01)

(56) References Cited

FOREIGN PATENT DOCUMENTS

| | | |
|---|---|---|
| CN | 102821147 A | 12/2012 |
| CN | 103095736 A | 5/2013 |
| CN | 103384089 A | 11/2013 |
| CN | 104052150 A | 9/2014 |
| CN | 204695016 U | 10/2015 |
| CN | 105471365 A | 4/2016 |
| CN | 205545056 U | 8/2016 |
| WO | 2014200188 A1 | 12/2014 |

OTHER PUBLICATIONS

International Search Report and Written Opinion for Application No. PCT/CN2016/103796, dated Jan. 4, 2017, 10 Pages.
Hongbo Jian, Study on distributed power generation monitoring system of photovoltaic micro inverter, Full-text Database of China Ecellent Master's Thesis (vol. 2 of Engineering Technology), May 15, 2014, No. 5 2014, pp. 12-16 and 60-64.

* cited by examiner

HOUSEHOLD PHOTOVOLTAIC SYSTEM AND SMART MICRO-GRID SYSTEM

CROSS-REFERENCE TO RELATED APPLICATION APPLICATIONS

This application is the U.S. national phase of PCT Application No. PCT/CN2016/103796 filed on Oct. 28, 2016, which claims priority to Chinese Patent Application No. 201610052854.3 filed on Jan. 26, 2016, the disclosures of which are incorporated in their entirety by reference herein.

TECHNICAL FIELD

The present disclosure relates to the field of photovoltaic power generation technology, in particular to a household photovoltaic system and a smart micro-grid system.

BACKGROUND

Usually, a current household photovoltaic system may process and monitor in real time output data from a photovoltaic inverter. In the related art, the output data from the photovoltaic inverter is monitored using a power line carrier communication technique.

However, for the power line carrier communication technique, an interference source is located within a power line, so an anti-interference capability is low and the communication quality may not be ensured. In addition, due to the deficiencies of the power line carrier communication technique in terms of distance, communication rate and networking capability, the system cost may increase.

SUMMARY

An object of the present disclosure is to provide a household photovoltaic system and a smart micro-grid system, so as to solve the problems in the related art where the household photovoltaic system is operated inconveniently with a high cost, a high transmission noise and bad communication quality in the case of monitoring the relevant data using the power line carrier communication technique.

In one aspect, the present disclosure provides in some embodiments a household photovoltaic system, including a photovoltaic assembly module, a household photovoltaic inverter and an alternating current (AC) grid. The household photovoltaic system further includes a monitoring assembly and a wireless communication assembly. The monitoring assembly includes direct current (DC)-side monitoring assemblies each configured to monitor an operating parameter of an output end of the photovoltaic assembly module, and AC-side monitoring assemblies each configured to monitor an operating parameter of an output end of the household photovoltaic inverter. The wireless communication assembly includes a DC-side wireless communication assembly configured to transmit the operating parameter monitored by each DC-side monitoring assembly to a predetermined monitoring terminal, and an AC-side wireless communication assembly configured to transmit the operating parameter monitored by each AC-side monitoring assembly to the predetermined monitoring terminal.

In a possible embodiment of the present disclosure, the DC-side wireless communication assembly includes one Zigbee central node and several Zigbee remote nodes. Each Zigbee remote node is configured to receive monitoring data transmitted by the DC-side monitoring assemblies within a first predetermined range in accordance with a predetermined period, and transmit the received monitoring data to the Zigbee central node in a remote wireless communication mode. The Zigbee central node is configured to receive monitoring data from the Zigbee remote nodes within a second predetermined range, and transmit the received monitoring data to the monitoring terminal.

In a possible embodiment of the present disclosure, the AC-side wireless communication assembly includes one Zigbee central node and several Zigbee remote nodes. Each Zigbee remote node is configured to receive monitoring data transmitted by the AC-side monitoring assemblies within a first predetermined range in accordance with a predetermined period, and transmit the received monitoring data to the Zigbee central node in a remote wireless communication mode. The Zigbee central node is configured to receive monitoring data from the Zigbee remote nodes within a second predetermined range, and transmit the received monitoring data to the monitoring terminal.

In a possible embodiment of the present disclosure, the monitoring assembly further includes ammeter-side monitoring assemblies each configured to monitor an operating parameter of a predetermined grid-access ammeter, and the wireless communication assembly further includes an ammeter-side wireless communication assembly configured to transmit the operating parameter monitored by each ammeter-side monitoring assembly to the monitoring terminal.

In a possible embodiment of the present disclosure, the ammeter-side wireless communication assembly includes one Zigbee central node and several Zigbee remote nodes. Each Zigbee remote node is configured to receive monitoring data transmitted by the ammeter-side monitoring assemblies within a first predetermined range in accordance with a predetermined period, and transmit the received monitoring data to the Zigbee central node in a remote wireless communication mode. The Zigbee central node is configured to receive monitoring data from the Zigbee remote nodes within a second predetermined range, and transmit the received monitoring data to the monitoring terminal.

In a possible embodiment of the present disclosure, the first predetermined range is a range having a radius of 1 to 500 m, with each Zigbee remote node as a center.

In a possible embodiment of the present disclosure, the second predetermined range is a range having a radius of 1 to 5 km, with the Zigbee central node as a center.

In a possible embodiment of the present disclosure, the remote wireless communication mode is a General Packet Radio Service (GPRS) and/or Code Division Multiple Access (CDMA) remote wireless communication mode.

In a possible embodiment of the present disclosure, the monitoring terminal is an upper computer and/or a handheld smart device.

In another aspect, the present disclosure provides in some embodiments a smart micro-grid system, including a DC micro-grid system, a household photovoltaic inverter and an AC grid. The smart micro-grid system further includes a monitoring assembly and a wireless communication assembly. The monitoring assembly includes DC-side monitoring assemblies each configured to monitor an operating parameter of an output end of the DC micro-grid system, and AC-side monitoring assemblies each configured to monitor an operating parameter of an output end of the household photovoltaic inverter. The wireless communication assembly includes a DC-side wireless communication assembly configured to transmit the operating parameter monitored by each DC-side monitoring assembly to a predetermined monitoring terminal, and an AC-side wireless communication assembly configured to transmit the operating parameter monitored by each AC-side monitoring assembly to the predetermined monitoring terminal.

In a possible embodiment of the present disclosure, the DC-side wireless communication assembly includes one Zigbee central node and several Zigbee remote nodes. Each Zigbee remote node is configured to receive monitoring data transmitted by the DC-side monitoring assemblies within a first predetermined range in accordance with a predetermined period, and transmit the received monitoring data to the Zigbee central node in a remote wireless communication mode. The Zigbee central node is configured to receive monitoring data from the Zigbee remote nodes within a second predetermined range, and transmit the received monitoring data to the monitoring terminal.

In a possible embodiment of the present disclosure, the AC-side wireless communication assembly includes one Zigbee central node and several Zigbee remote nodes. Each Zigbee remote node is configured to receive monitoring data transmitted by the AC-side monitoring assemblies within a first predetermined range in accordance with a predetermined period, and transmit the received monitoring data to the Zigbee central node in a remote wireless communication mode. The Zigbee central node is configured to receive monitoring data from the Zigbee remote nodes within a second predetermined range, and transmit the received monitoring data to the monitoring terminal.

In a possible embodiment of the present disclosure, the monitoring assembly further includes ammeter-side monitoring assemblies each configured to monitor an operating parameter of a predetermined grid-access ammeter, and the wireless communication assembly further includes an ammeter-side wireless communication assembly configured to transmit the operating parameter monitored by each ammeter-side monitoring assembly to the monitoring terminal.

In a possible embodiment of the present disclosure, the ammeter-side wireless communication assembly includes one Zigbee central node and several Zigbee remote nodes. Each Zigbee remote node is configured to receive monitoring data transmitted by the ammeter-side monitoring assemblies within a first predetermined range in accordance with a predetermined period, and transmit the received monitoring data to the Zigbee central node in a remote wireless communication mode. The Zigbee central node is configured to receive monitoring data from the Zigbee remote nodes within a second predetermined range, and transmit the received monitoring data to the monitoring terminal.

In a possible embodiment of the present disclosure, the first predetermined range is a range having a radius of 1 to 500 m, with each Zigbee remote node as a center.

In a possible embodiment of the present disclosure, the second predetermined range is a range having a radius of 1 to 5 km, with the Zigbee central node as a center.

In a possible embodiment of the present disclosure, the remote wireless communication mode is a GPRS and/or CDMA remote wireless communication mode.

In a possible embodiment of the present disclosure, the monitoring terminal is an upper computer and/or a handheld smart device.

In a possible embodiment of the present disclosure, the smart micro-grid system further includes a micro-grid management system configured to manage the DC micro-grid system, to enable the DC micro-grid system to operate in a first predetermined operation mode.

In a possible embodiment of the present disclosure, the smart micro-grid system further includes an AC grid management and scheduling system configured to manage the AC grid and/or the micro-grid management system, to enable the AC grid and/or the micro-grid management system to operate in a second predetermined operation mode.

According to the embodiments of the present disclosure, the household photovoltaic system may use the wireless communication assembly to monitor the relevant data, so as to solve the problems in the related art where the household photovoltaic system is operated inconveniently with a high cost, a high transmission noise and bad communication quality in the case of monitoring the relevant data using a power line carrier communication technique. In addition, through the wireless communication assembly, it is able to improve the data communication and monitoring even in the case that the household photovoltaic systems are distributed scatteredly in a wide region.

Further, the household photovoltaic system may be used to, apart from monitoring the output end of the photovoltaic inverter so as to enable a user or a manager to know in real time an operating state of the photovoltaic inverter, monitor the output end of the photovoltaic assembly module, so as to enable the user or the manager to know in real time an operating state of the photovoltaic assembly module, thereby to inspect and maintain a photovoltaic assembly of the photovoltaic assembly module in the case that a failure occurs for the photovoltaic assembly.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
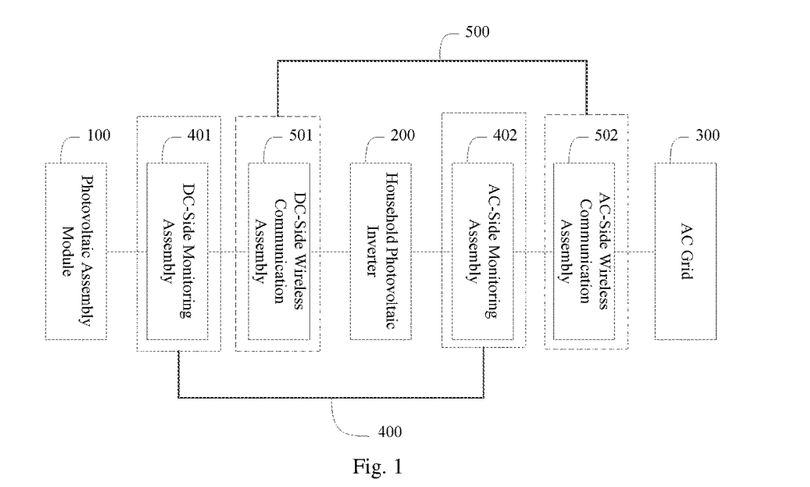
FIG. 1 is a schematic view showing a household photovoltaic system according to one embodiment of the present disclosure.

The present disclosure provides in some embodiments a household photovoltaic system which, as shown in FIG. 1, includes: a photovoltaic assembly module 100, a household photovoltaic inverter 200 and an AC grid 300. The household photovoltaic system further includes a monitoring assembly 400 and a wireless communication assembly 500.

The monitoring assembly 400 includes DC-side monitoring assemblies 401 and AC-side monitoring assemblies 402. Each DC-side monitoring assembly 401 is connected to the photovoltaic assembly module 100 and configured to monitor an operating parameter of an output end of the photovoltaic assembly module 100. Each AC-side monitoring assembly 402 is connected to the household photovoltaic inverter 200 and configured to monitor an operating parameter of an output end of the household photovoltaic inverter 200. Here, the monitoring assembly may be a sensor capable of monitoring such parameters as current, voltage and power, and the photovoltaic assembly may be a solar cell panel consisting of, e.g., a plurality of solar cells.

The wireless communication assembly 500 includes a DC-side wireless communication assembly 501 and an AC-side wireless communication assembly 502. The DC-side wireless communication assembly 501 is configured to transmit the operating parameter monitored by each DC-side monitoring assembly 401 to a predetermined monitoring terminal. In addition, the DC-side wireless communication assembly 501 is further configured to transmit the operating parameter monitored by each DC-side monitoring assembly 401 to a predetermined database. Further, the predetermined monitoring terminal may acquire the operating parameter monitored by the DC-side monitoring assembly 401 from the predetermined database. The AC-side wireless communication assembly 502 is configured to transmit the operating parameter monitored by each AC-side monitoring assembly 402 to the predetermined monitoring terminal. In addition, the AC-side wireless communication assembly 502 is further configured to transmit the operating parameter monitored by each AC-side monitoring assembly 402 to the predetermined database. Further, the predetermined monitoring terminal may also acquire the operating parameter monitored by the AC-side monitoring assembly 402 from the predetermined database. Here, the monitoring terminal may be an upper computer and/or a handheld smart device.

According to the embodiments of the present disclosure, the household photovoltaic system may use the wireless communication assembly to monitor the relevant data, so as to solve the problems in the related art where the household photovoltaic system is operated inconveniently with a high cost, a high transmission noise and bad communication quality in the case of monitoring the relevant data using a power line carrier communication technique. In addition, through the wireless communication assembly, it is able to improve the data communication and monitoring even in the case that the household photovoltaic systems are distributed scatteredly in a wide region.

Further, the household photovoltaic system may be used to, apart from monitoring the output end of the photovoltaic inverter so as to enable a user or a manager to know in real time an operating state of the photovoltaic inverter, monitor the output end of the photovoltaic assembly module, so as to enable the user or the manager to know in real time an operating state of the photovoltaic assembly module, thereby to inspect and maintain a photovoltaic assembly of the photovoltaic assembly module in the case that a failure occurs for the photovoltaic assembly.

Figure 2:
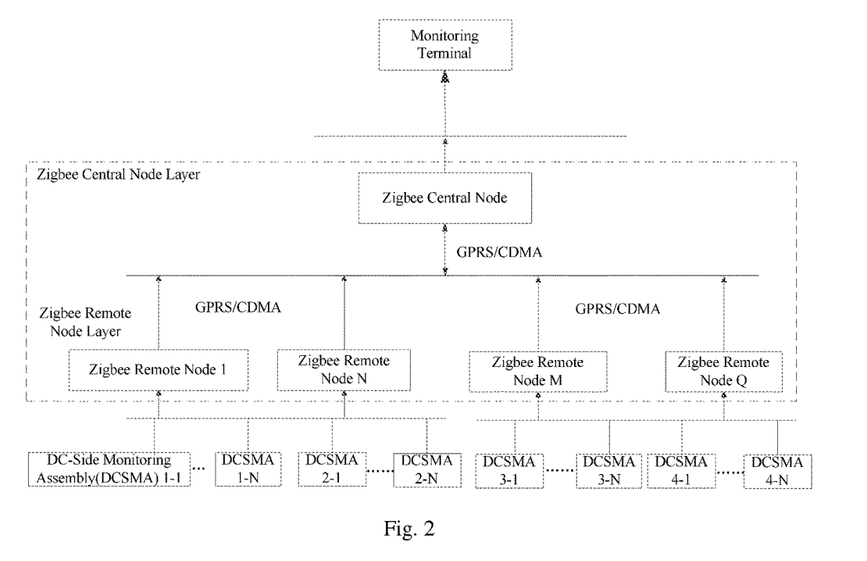
FIG. 2 is a schematic view showing the data transmission at a Zigbee level for a DC-side wireless communication assembly.

A specific implementation mode of the DC-side wireless communication assembly is given in some embodiments of the present disclosure. As shown in FIG. 2, which is a schematic view showing the data communication at a Zigbee level for the DC-side wireless communication assembly, the DC-side wireless communication assembly 501 includes one Zigbee central node and several Zigbee remote nodes. Each Zigbee remote node is configured to receive monitoring data transmitted by the DC-side monitoring assemblies 401 within a first predetermined range in accordance with a predetermined period, and transmit the received monitoring data to the Zigbee central node in a remote wireless communication mode. The Zigbee central node is configured to receive monitoring data from the Zigbee remote nodes within a second predetermined range, and transmit the received monitoring data to the monitoring terminal.

In a possible embodiment of the present disclosure, the predetermined period is 1 to 3 hours.

In a possible embodiment of the present disclosure, the first predetermined range is a range having a radius of 1 to 500 m, with the Zigbee remote node as a center.

In a possible embodiment of the present disclosure, the second predetermined range is a range having a radius of 1 to 5 km, with the Zigbee central node as a center.

In a possible embodiment of the present disclosure, the remote wireless communication mode is a GPRS and/or CDMA remote wireless communication mode.

As mentioned above, a Zigbee communication technique has been adopted by the DC-side wireless communication assembly 501 in this embodiment. The DC-side wireless communication assembly 501 includes the Zigbee remote nodes and the Zigbee central node. Each Zigbee remote node takes charge of communicating with the DC-side monitoring assembly 401, so as to receive the monitoring data from the DC-side monitoring assembly 401. The Zigbee central node takes charge of receiving the monitoring data from the Zigbee remote node. As shown in FIG. 2, the Zigbee remote nodes form a Zigbee remote node layer, and the Zigbee central node forms a Zigbee central node layer.

Each Zigbee remote node may receive the monitoring data from a plurality of DC-side monitoring assemblies 401 within the first predetermined range, and the Zigbee central node may receive the monitoring data from a plurality of Zigbee remote nodes within the second predetermined range. Upon the receipt of the monitoring data from the plurality of Zigbee remote nodes, the Zigbee central node may package and upload the monitoring data to the predetermined monitoring terminal and the corresponding database. Hence, due to a hierarchical processing mode adopted by the DC-side wireless communication assembly 501, the Zigbee remote node layer may receive the monitoring data from the plurality of DC-side monitoring assemblies 401 adjacent thereto, and the Zigbee central node may receive the monitoring data from the plurality of Zigbee remote nodes far away therefrom. Through the hierarchical processing mode, it is able for the household photovoltaic systems distributed scatteredly to upload, process and monitor the DC-side monitoring data in a centralized manner.

Figure 3:
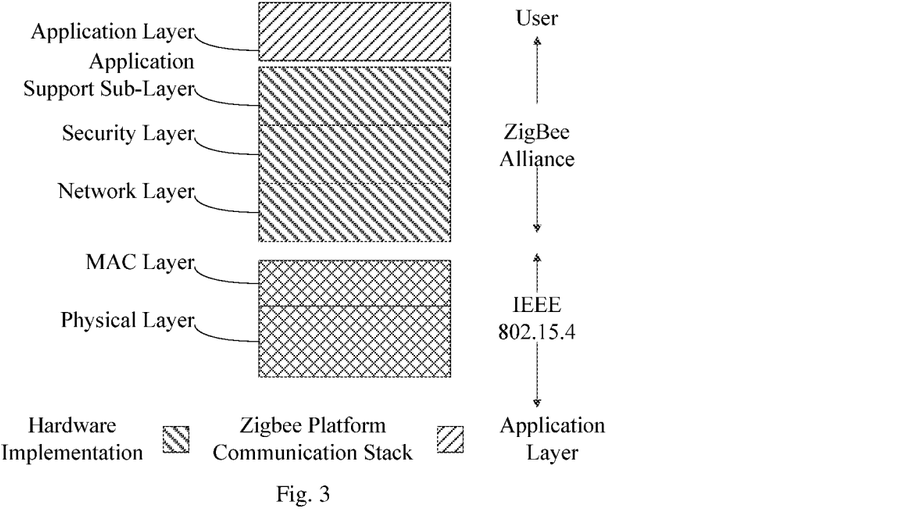
FIG. 3 is a schematic view showing architecture of Zigbee stack.

A Zigbee stack is established on the basis of Institute of Electrical and Electronic Engineers (IEEE) 802.15.4, and FIG. 3 shows a structure of the Zigbee stack, including, from bottom to top, a physical layer, a Media Access Control (MAC) layer, a network/security layer, an application support sub-layer, and an application layer. As a bottommost layer of a protocol, the physical layer takes charge of interacting directly with the outside and it is mainly used to control the operation of a radio frequency (RF) transceiver. The MAC layer takes charge of establishing, maintaining and terminating a wireless data link between devices, and transmitting and receiving data in an acknowledged mode. The network/security layer mainly takes charge of establishing a new network, guaranteeing the data transmission, encrypting the data, and guaranteeing the data integrity. The application support sub-layer takes charge of the communication between among a plurality of devices in accordance with services and requirements. The application layer is mainly developed by the user in accordance with specific applications.

As compared with the power line carrier communication technique in the related art, the Zigbee communication technique adopted by the wireless communication assembly in this embodiment has the following advantages, apart from convenience and low cost.

Zigbee communication has become a series of technical standards for networking, security and application software developed in accordance with a wireless standard 802.15.4 approved by IEEE (in contrast, there is no industry standard for the power line carrier communication technique). A Zigbee communication rate is far greater than a common power line communication (PLC) rate, up to 250 kbps. In addition, the Zigbee communication has a relatively large visual range, e.g., 3000 feet in the case of a power amplifier (PA) and no barriers, and 500 m as recommended. However, due to a relatively strong routing ability, the defect in the distance may be overcome. Further, due to the Zigbee networking capability, as one of the most important advantages in the wireless network field, the Zigbee communication may support routing and a Mesh network, and there is no limit to the number of nodes (theoretically more than 60 thousands nodes). As another most important advantage, the Zigbee communication has low power consumption, and as a full digital system, its power consumption completely occurs during the data transmission and reception.

Figure 4:
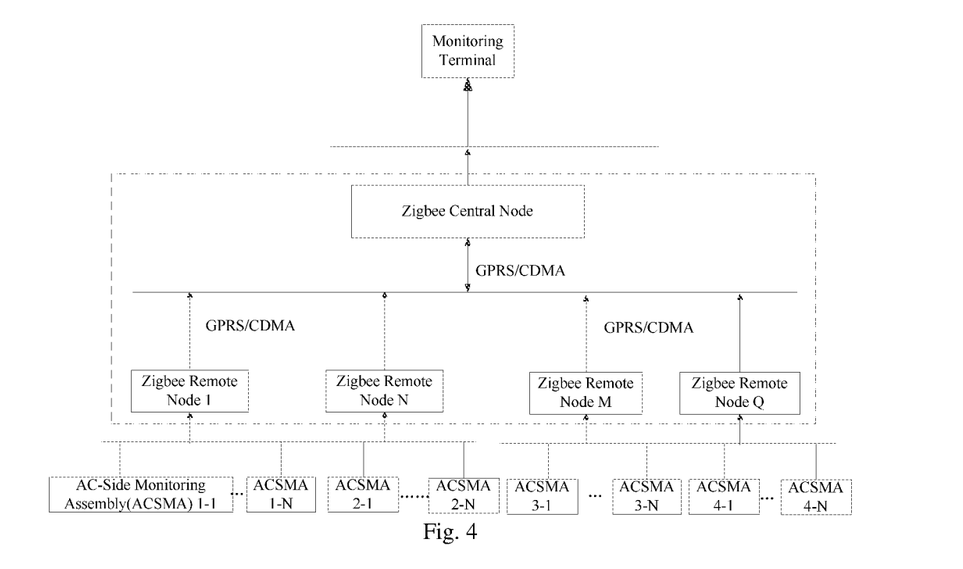
FIG. 4 is a schematic view showing the data transmission at a Zigbee level for an AC-side wireless communication assembly.

A specific implementation mode of the AC-side wireless communication assembly is given in some embodiments of the present disclosure. As shown in FIG. 4, which is a schematic view showing the data transmission at a Zigbee level for the AC-side wireless communication assembly, the AC-side wireless communication assembly 502 includes one Zigbee central node and several Zigbee remote nodes. Each Zigbee remote node is configured to receive monitoring data transmitted by the AC-side monitoring assemblies 402 within a first predetermined range in accordance with a predetermined period, and transmit the received monitoring data to the Zigbee central node in a remote wireless communication mode. The Zigbee central node is configured to receive monitoring data from the Zigbee remote nodes within a second predetermined range, and transmit the received monitoring data to the monitoring terminal.

In a possible embodiment of the present disclosure, the first predetermined range is a range having a radius of 1 to 500 m, with the Zigbee remote node as a center.

In a possible embodiment of the present disclosure, the second predetermined range is a range having a radius of 1 to 5 km, with the Zigbee central node as a center.

In a possible embodiment of the present disclosure, the remote wireless communication mode is a GPRS and/or CDMA remote wireless communication mode.

The AC-side wireless communication assembly in this embodiment has a technical effect similar to the abovementioned DC-side wireless communication assembly, which will thus not be particularly defined herein.

Figure 5:
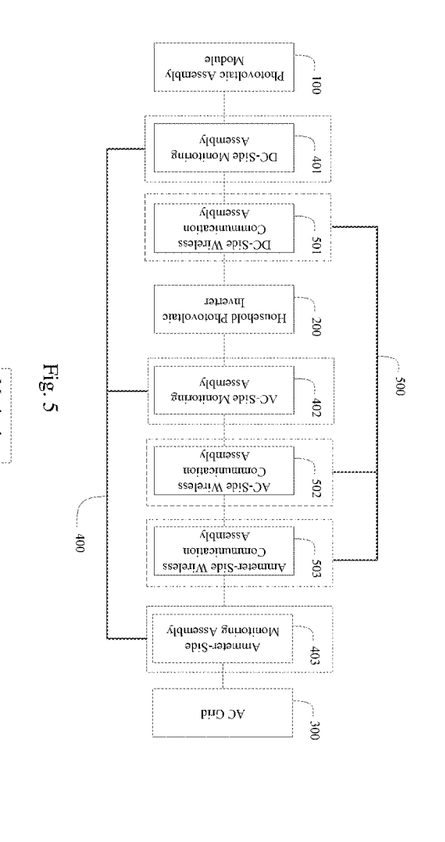
FIG. 5 is another schematic view showing the household photovoltaic system according to one embodiment of the present disclosure.

As shown in FIG. 5, the monitoring assembly 400 further includes ammeter-side monitoring assemblies 403 each configured to monitor an operating parameter of a predetermined grid-access ammeter, and the wireless communication assembly 500 further includes an ammeter-side wireless communication assembly 503 configured to transmit the operating parameter monitored by each ammeter-side monitoring assembly 403 to the monitoring terminal.

In this embodiment, apart from the DC-side monitoring assemblies 401 for monitoring a DC-side operating state and the AC-side monitoring assemblies 402 for monitoring an AC-side operating state, the monitoring assembly 400 may further include the ammeter-side monitoring assemblies 403 for monitoring a predetermined grid-access ammeter-side operating state. The ammeter-side monitoring assembly 403 is configured to monitor the operating parameter of the predetermined grid-access ammeter, e.g., a current rotational speed of the ammeter, and an ammeter reading. The ammeter-side monitoring assembly 403 may also be implemented by a collector or sensor. Correspondingly, the wireless communication assembly 500 may further include the ammeter-side wireless communication assembly 503 for transmitting the operating parameter monitored by each ammeter-side monitoring assembly 403 to the monitoring terminal. Hence, in the case that the AC cannot be delivered normally due to a failure occurring for the ammeter or a power failure occurring for the household photovoltaic system, the remote monitoring terminal may acquire this situation in time.

In a word, the household photovoltaic system in this embodiment may collect and monitor the data at the DC side, the AC side and the ammeter side, so as to ensure the normal operation of the household photovoltaic system and the in-time handling of the failures.

Figure 6:
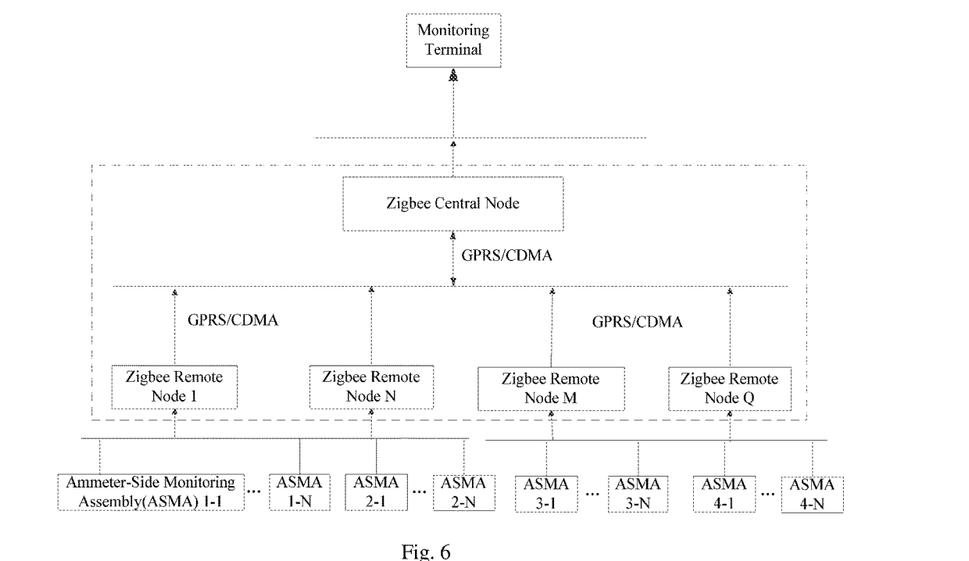
FIG. 6 is a schematic view showing the data transmission at a Zigbee level for an ammeter-side wireless communication assembly.

A specific implementation mode of the ammeter-side wireless communication assembly 503 is given in some embodiments of the present disclosure. As shown in FIG. 6, the ammeter-side wireless communication assembly 503 includes one Zigbee central node and several Zigbee remote nodes. Each Zigbee remote node is configured to receive monitoring data transmitted by the ammeter-side monitoring assemblies within a first predetermined range in accordance with a predetermined period, and transmit the received monitoring data to the Zigbee central node in a remote wireless communication mode. The Zigbee central node is configured to receive monitoring data from the Zigbee remote nodes within a second predetermined range, and transmit the received monitoring data to the monitoring terminal.

In a possible embodiment of the present disclosure, the first predetermined range is a range having a radius of 1 to 500 m, with the Zigbee remote node as a center.

In a possible embodiment of the present disclosure, the second predetermined range is a range having a radius of 1 to 5 km, with the Zigbee central node as a center.

In a possible embodiment of the present disclosure, the remote wireless communication mode is a GPRS and/or CDMA remote wireless communication mode.

The ammeter-side wireless communication assembly in this embodiment has a technical effect similar to the above-mentioned DC-side wireless communication assembly, which will thus not be particularly defined herein.

Figure 7:
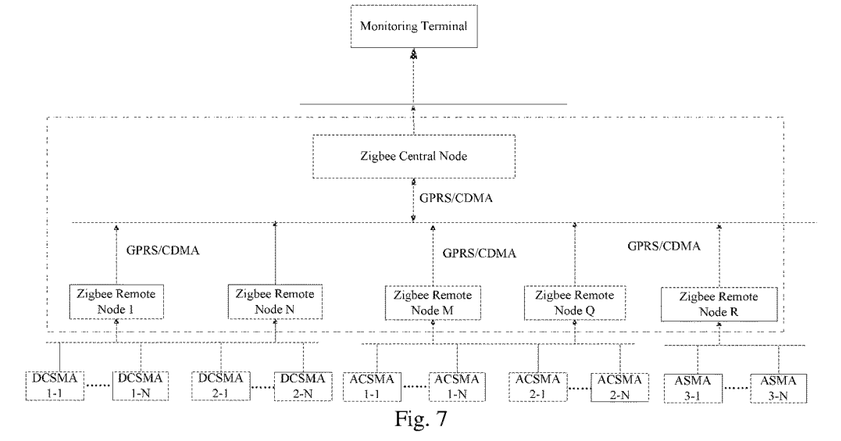
FIG. 7 is a schematic view showing the data transmission at a Zigbee level for the DC-side, AC-side and ammeter-side wireless communication assemblies.

FIG. 7 is a schematic view showing the data communication at a Zigbee level for the DC-side wireless communication assembly 501, the AC-side wireless communication assembly 502 and the ammeter-side wireless communication assembly 503. As shown in FIG. 7, the Zigbee communication may be added at the DC output side, so as to monitor a DC-side state. A DC may be converted by the photovoltaic inverter into a controllable sinusoidal AC which is then delivered to the grid. The Zigbee communication may then be added at an output side of the photovoltaic inverter and a grid-access ammeter side. In this way, it is able to collect and monitor the data at the DC side, the AC side and the ammeter side, so as to ensure the normal operation of the system and the in-time handling of the failures.

Figure 8:
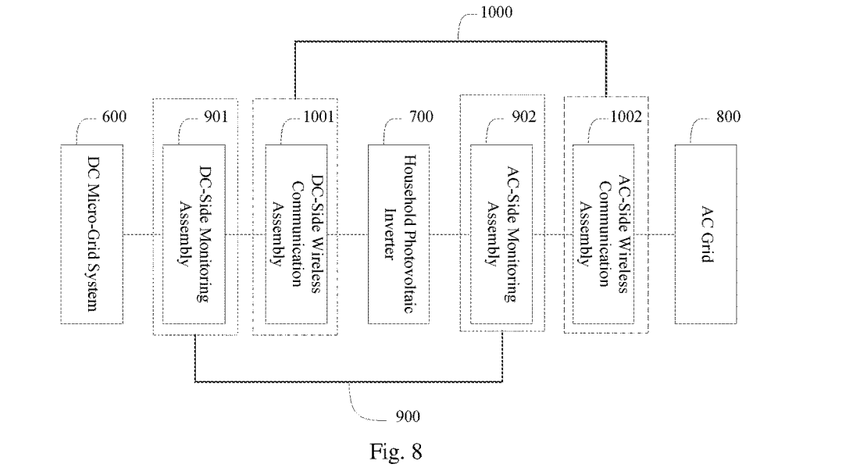
FIG. 8 is a schematic view showing a smart micro-grid system according to one embodiment of the present disclosure.

As shown in FIG. 8, the present disclosure further provides in some embodiments a smart micro-grid system, which includes a DC micro-grid system 600, a household photovoltaic inverter 700 and an AC grid 800. The smart micro-grid system further includes a monitoring assembly 900 and a wireless communication assembly 1000. The monitoring assembly 900 includes DC-side monitoring assemblies 901 each configured to monitor an operating parameter of an output end of the DC micro-grid system, and AC-side monitoring assemblies 902 each configured to monitor an operating parameter of an output end of the household photovoltaic inverter. The wireless communication assembly 1000 includes a DC-side wireless communication assembly 1001 configured to transmit the operating parameter monitored by each DC-side monitoring assembly 901 to a predetermined monitoring terminal, and an AC-side wireless communication assembly 1002 configured to transmit the operating parameter monitored by each AC-side monitoring assembly 902 to the predetermined monitoring terminal. Here, the monitoring terminal is an upper computer and/or a handheld smart device.

According to the embodiments of the present disclosure, the smart micro-grid system may use the wireless communication assembly to monitor the relevant data from the DC micro-grid system, so as to solve the problems in the related art where the household photovoltaic system is operated inconveniently with a high cost, a high transmission noise and bad communication quality in the case of monitoring the relevant data using a power line carrier communication technique. In addition, through the wireless communication assembly, it is able to improve the data communication and monitoring even in the case that the DC micro-grid systems are distributed scatteredly in a wide region.

Further, the smart micro-grid system may be used to, apart from monitoring the output end of the photovoltaic inverter so as to enable a user or a manager to know in real time an operating state of the photovoltaic inverter, monitor the output end of the DC micro-grid system, so as to enable the user or the manager to know in real time an operating state of the DC micro-grid system, thereby to inspect and maintain the DC micro-grid system in the case that a failure occurs for the DC micro-grid system.

A specific implementation mode of the DC-side wireless communication assembly is given in some embodiments of the present disclosure. With reference to the structure in FIG. 2, the DC-side wireless communication assembly includes one Zigbee central node and several Zigbee remote nodes. Each Zigbee remote node is configured to receive monitoring data transmitted by the DC-side monitoring assemblies within a first predetermined range in accordance with a predetermined period, and transmit the received monitoring data to the Zigbee central node in a remote wireless communication mode. The Zigbee central node is configured to receive monitoring data from the Zigbee remote nodes within a second predetermined range, and transmit the received monitoring data to the monitoring terminal.

In a possible embodiment of the present disclosure, the first predetermined range is a range having a radius of 1 to 500 m, with the Zigbee remote node as a center.

In a possible embodiment of the present disclosure, the second predetermined range is a range having a radius of 1 to 5 km, with the Zigbee central node as a center.

In a possible embodiment of the present disclosure, the remote wireless communication mode is a GPRS and/or CDMA remote wireless communication mode.

The DC-side wireless communication assembly in this embodiment has a technical effect similar to that mentioned above, which will thus not be particularly defined herein.

A specific implementation mode of the AC-side wireless communication assembly is given in some embodiments of the present disclosure. With reference to the structure in FIG. 4, the AC-side wireless communication assembly includes one Zigbee central node and several Zigbee remote nodes. Each Zigbee remote node is configured to receive monitoring data transmitted by the AC-side monitoring assemblies within a first predetermined range in accordance with a predetermined period, and transmit the received monitoring data to the Zigbee central node in a remote wireless communication mode. The Zigbee central node is configured to receive monitoring data from the Zigbee remote nodes within a second predetermined range, and transmit the received monitoring data to the monitoring terminal.

In a possible embodiment of the present disclosure, the first predetermined range is a range having a radius of 1 to 500 m, with the Zigbee remote node as a center.

In a possible embodiment of the present disclosure, the second predetermined range is a range having a radius of 1 to 5 km, with the Zigbee central node as a center.

In a possible embodiment of the present disclosure, the remote wireless communication mode is a GPRS and/or CDMA remote wireless communication mode.

The AC-side wireless communication assembly in this embodiment has a technical effect similar to that mentioned above, which will thus not be particularly defined herein.

Figure 9:
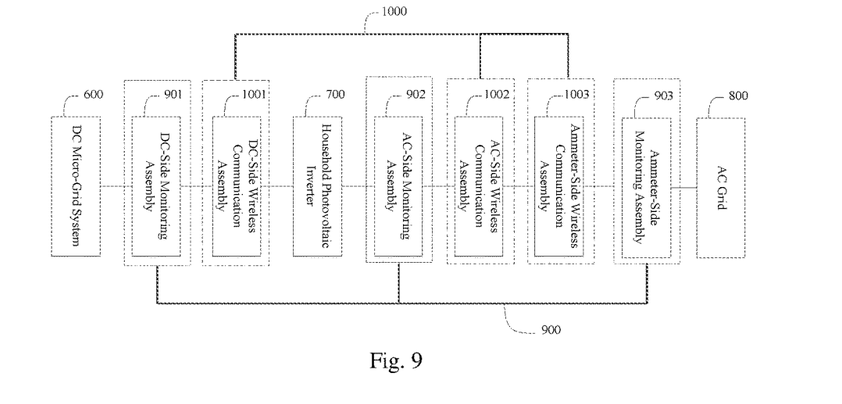
FIG. 9 is another schematic view showing the smart micro-grid system according to one embodiment of the present disclosure.

As shown in FIG. 9, the monitoring assembly 900 further includes ammeter-side monitoring assemblies 903 each configured to monitor an operating parameter of a predetermined grid-access ammeter, and correspondingly, the wireless communication assembly 1000 further includes an ammeter-side wireless communication assembly 1003 configured to transmit the operating parameter monitored by each ammeter-side monitoring assembly 903 to the monitoring terminal. This embodiment has a technical effect similar to that mentioned above, which will thus not be particularly defined herein.

A specific implementation mode of the ammeter-side wireless communication assembly is given in some embodiments of the present disclosure. With reference to the structure in FIG. 6, the ammeter-side wireless communication assembly includes one Zigbee central node and several Zigbee remote nodes. Each Zigbee remote node is configured to receive monitoring data transmitted by the ammeter-side monitoring assemblies within a first predetermined range in accordance with a predetermined period, and transmit the received monitoring data to the Zigbee central node in a remote wireless communication mode. The Zigbee central node is configured to receive monitoring data from the Zigbee remote nodes within a second predetermined range, and transmit the received monitoring data to the monitoring terminal.

In a possible embodiment of the present disclosure, the first predetermined range is a range having a radius of 1 to 500 m, with the Zigbee remote node as a center.

In a possible embodiment of the present disclosure, the second predetermined range is a range having a radius of 1 to 5 km, with the Zigbee central node as a center.

In a possible embodiment of the present disclosure, the remote wireless communication mode is a GPRS and/or CDMA remote wireless communication mode.

The ammeter-side wireless communication assembly in this embodiment has a technical effect similar to that mentioned above, which will thus not be particularly defined herein.

Figure 10:
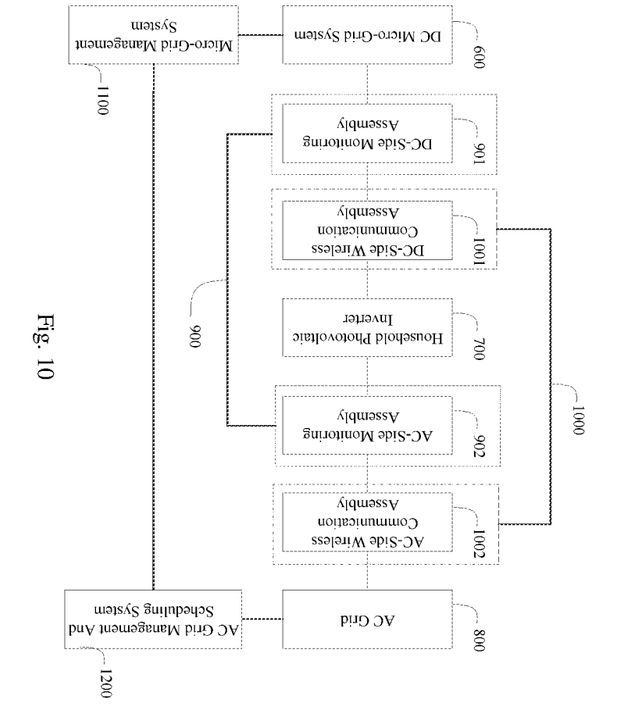
FIG. 10 is yet another schematic view showing the smart micro-grid system according to one embodiment of the present disclosure.

As shown in FIG. 10, the smart micro-grid system further includes a micro-grid management system 1100 configured to manage the DC micro-grid system, so as to enable the DC micro-grid system to operate in a first predetermined operation mode.

The smart micro-grid system may further include the AC grid management and scheduling system 1100 configured to manage the DC micro-grid system, so as to enable the DC micro-grid system to operate in the first predetermined operation mode. Here, the first predetermined operation mode refers to an operation mode preset by the user in accordance with the practical need, e.g., an operation mode where output power of the DC micro-grid system is 600 W, or an operation mode where the DC micro-grid system operates in an off-grid or a grid-connected manner.

As shown in FIG. 10, the smart micro-grid system further includes an AC grid management and scheduling system 1200 configured to manage the AC grid 800 and/or the micro-grid management system 1100, so as to enable the AC grid 800 and/or the micro-grid management system 1100 to operate in a second predetermined operation mode.

The smart micro-grid system may further include the AC grid management and scheduling system 1200 configured to manage the AC grid 800 and/or the micro-grid management system 1100, so as to enable the AC grid 800 and/or the micro-grid management system 1100 to operate in the second predetermined operation mode. Here, the second predetermined operation mode refers to an operation mode preset by the user in accordance with the practical need, e.g., an operation mode where the DC micro-grid system ceases to work and the AC grid operates normally under the control of the micro-grid management system 1100.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A household photovoltaic system, comprising a photovoltaic assembly module, a household photovoltaic inverter and an alternating current (AC) grid, wherein
   the household photovoltaic system further comprises a monitoring assembly and a wireless communication assembly;
   the monitoring assembly comprises direct current (DC)-side monitoring assemblies each configured to monitor an operating parameter of an output end of the photovoltaic assembly module, and AC-side monitoring assemblies each configured to monitor an operating parameter of an output end of the household photovoltaic inverter; and
   the wireless communication assembly comprises a DC-side wireless communication assembly configured to transmit the operating parameter monitored by each DC-side monitoring assembly to a predetermined monitoring terminal, and an AC-side wireless communication assembly configured to transmit the operating parameter monitored by each AC-side monitoring assembly to the predetermined monitoring terminal.

2. The household photovoltaic system according to claim 1, wherein the DC-side wireless communication assembly comprises one Zigbee central node and several Zigbee remote nodes;
   each Zigbee remote node is configured to receive monitoring data transmitted by the DC-side monitoring assemblies within a first predetermined range in accordance with a predetermined period, and transmit the received monitoring data to the Zigbee central node in a remote wireless communication mode; and
   the Zigbee central node is configured to receive monitoring data from the Zigbee remote nodes within a second predetermined range, and transmit the received monitoring data to the monitoring terminal.

3. The household photovoltaic system according to claim 1, wherein the AC-side wireless communication assembly comprises one Zigbee central node and several Zigbee remote nodes;
   each Zigbee remote node is configured to receive monitoring data transmitted by the AC-side monitoring assemblies within a first predetermined range in accordance with a predetermined period, and transmit the received monitoring data to the Zigbee central node in a remote wireless communication mode; and
   the Zigbee central node is configured to receive monitoring data from the Zigbee remote nodes within a second predetermined range, and transmit the received monitoring data to the monitoring terminal.

4. The household photovoltaic system according to claim 1, wherein the monitoring assembly further comprises ammeter-side monitoring assemblies each configured to monitor an operating parameter of a predetermined grid-access ammeter, and the wireless communication assembly further comprises an ammeter-side wireless communication assembly configured to transmit the operating parameter monitored by each ammeter-side monitoring assembly to the monitoring terminal.

5. The household photovoltaic system according to claim 4, wherein the ammeter-side wireless communication assembly comprises one Zigbee central node and several Zigbee remote nodes;
   each Zigbee remote node is configured to receive monitoring data transmitted by the ammeter-side monitoring assemblies within a first predetermined range in accordance with a predetermined period, and transmit the received monitoring data to the Zigbee central node in a remote wireless communication mode; and the Zigbee central node is configured to receive monitoring data from the Zigbee remote nodes within a second predetermined range, and transmit the received monitoring data to the monitoring terminal.

6. The household photovoltaic system according to claim 2, wherein the first predetermined range is a range having a radius of 1 to 500 m, with each Zigbee remote node as a center.

7. The household photovoltaic system according to claim 2, wherein the second predetermined range is a range having a radius of 1 to 5 km, with the Zigbee central node as a center.

8. The household photovoltaic system according to claim 2, wherein the remote wireless communication mode is a General Packet Radio Service (GPRS) and/or Code Division Multiple Access (CDMA) remote wireless communication mode.

9. The household photovoltaic system according to claim 1, wherein the monitoring terminal is an upper computer and/or a handheld smart device.

10. A smart micro-grid system, comprising a direct current (DC) micro-grid system, a household photovoltaic inverter and an alternating current (AC) grid, wherein
the smart micro-grid system further comprises a monitoring assembly and a wireless communication assembly;
the monitoring assembly comprises DC-side monitoring assemblies each configured to monitor an operating parameter of an output end of the DC micro-grid system, and AC-side monitoring assemblies each configured to monitor an operating parameter of an output end of the household photovoltaic inverter; and
the wireless communication assembly comprises a DC-side wireless communication assembly configured to transmit the operating parameter monitored by each DC-side monitoring assembly to a predetermined monitoring terminal, and an AC-side wireless communication assembly configured to transmit the operating parameter monitored by each AC-side monitoring assembly to the predetermined monitoring terminal.

11. The smart micro-grid system according to claim 10, wherein the DC-side wireless communication assembly comprises one Zigbee central node and several Zigbee remote nodes;
each Zigbee remote node is configured to receive monitoring data transmitted by the DC-side monitoring assemblies within a first predetermined range in accordance with a predetermined period, and transmit the received monitoring data to the Zigbee central node in a remote wireless communication mode; and
the Zigbee central node is configured to receive monitoring data from the Zigbee remote nodes within a second predetermined range, and transmit the received monitoring data to the monitoring terminal.

12. The smart micro-grid system according to claim 10, wherein the AC-side wireless communication assembly comprises one Zigbee central node and several Zigbee remote nodes;

each Zigbee remote node is configured to receive monitoring data transmitted by the AC-side monitoring assemblies within a first predetermined range in accordance with a predetermined period, and transmit the received monitoring data to the Zigbee central node in a remote wireless communication mode; and the Zigbee central node is configured to receive monitoring data from the Zigbee remote nodes within a second predetermined range, and transmit the received monitoring data to the monitoring terminal.

13. The smart micro-grid system according to claim 10, wherein the monitoring assembly further comprises ammeter-side monitoring assemblies each configured to monitor an operating parameter of a predetermined grid-access ammeter, and the wireless communication assembly further comprises an ammeter-side wireless communication assembly configured to transmit the operating parameter monitored by each ammeter-side monitoring assembly to the monitoring terminal.

14. The smart micro-grid system according to claim 13, wherein the ammeter-side wireless communication assembly comprises one Zigbee central node and several Zigbee remote nodes;
each Zigbee remote node is configured to receive monitoring data transmitted by the ammeter-side monitoring assemblies within a first predetermined range in accordance with a predetermined period, and transmit the received monitoring data to the Zigbee central node in a remote wireless communication mode; and
the Zigbee central node is configured to receive monitoring data from the Zigbee remote nodes within a second predetermined range, and transmit the received monitoring data to the monitoring terminal.

15. The smart micro-grid system according to claim 11, wherein the first predetermined range is a range having a radius of 1 to 500 m, with each Zigbee remote node as a center.

16. The smart micro-grid system according to claim 11, wherein the second predetermined range is a range having a radius of 1 to 5 km, with the Zigbee central node as a center.

17. The smart micro-grid system according to claim 11, wherein the remote wireless communication mode is a General Packet Radio Service (GPRS) and/or Code Division Multiple Access (CDMA) remote wireless communication mode.

18. The smart micro-grid system according to claim 11, wherein the monitoring terminal is an upper computer and/or a handheld smart device.

19. The smart micro-grid system according to claim 10, further comprising a micro-grid management system configured to manage the DC micro-grid system, to enable the DC micro-grid system to operate in a first predetermined operation mode.

20. The smart micro-grid system according to claim 19, further comprising an AC grid management and scheduling system configured to manage the AC grid and/or the micro-grid management system, to enable the AC grid and/or the micro-grid management system to operate in a second predetermined operation mode.

* * * * *